United States Patent [19]

Aritome et al.

[11] Patent Number: 5,698,879
[45] Date of Patent: Dec. 16, 1997

[54] NONVOLATILE SEMICONDUCTOR MEMORY DEVICE

[75] Inventors: Seiichi Aritome; Tomoharu Tanaka, both of Yokohama; Ken Takeuchi, Tokyo, all of Japan

[73] Assignee: Kabushiki Kaisha Toshiba, Kawasaki, Japan

[21] Appl. No.: 516,924

[22] Filed: Aug. 18, 1995

[30] Foreign Application Priority Data

Aug. 19, 1994 [JP] Japan .................. 6-195767

[51] Int. Cl.$^6$ .................. H01L 29/788
[52] U.S. Cl. .................. 257/315; 257/316; 257/319; 257/320; 257/324; 257/326; 257/390; 257/401
[58] Field of Search .................. 257/315, 316, 257/319, 320, 321, 322, 324, 326, 390, 401, 406

[56] References Cited

U.S. PATENT DOCUMENTS 4,816,883  3/1989  Baldi .................. 257/322

FOREIGN PATENT DOCUMENTS 2-74069   3/1990  Japan .
2-177199  7/1990  Japan .

OTHER PUBLICATIONS

A High Density EPROM Cell and Array, R. Stewart, et al., May 28–30, 1986, Symposium on VLSI Technology, pp. 89–90.

*Primary Examiner*—Edward Wojciechowicz
*Attorney, Agent, or Firm*—Oblon, Spivak, McClelland, Maier & Neustadt, P.C.

[57] ABSTRACT

A nonvolatile semiconductor memory device has reduced parasitic capacitance at a select transistor obtained by providing a depletion-mode select transistor with a charge accumulation layer, virtually making a gate insulating film thicker, or providing under the gate insulating film a channel layer that is of a same conductivity type as that of a source and drain regions and connects thereto, thereby enabling the potential of the select gate to be almost fixed at a desired value, preventing a faulty operation and making it possible to cause the select transistor to operate at high speed.

25 Claims, 12 Drawing Sheets

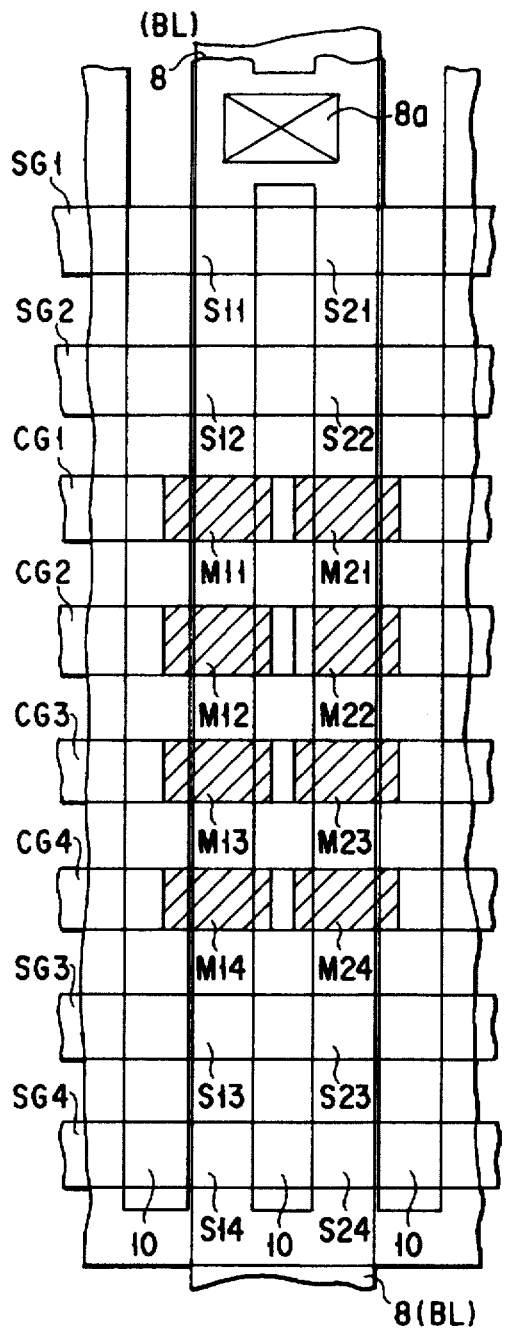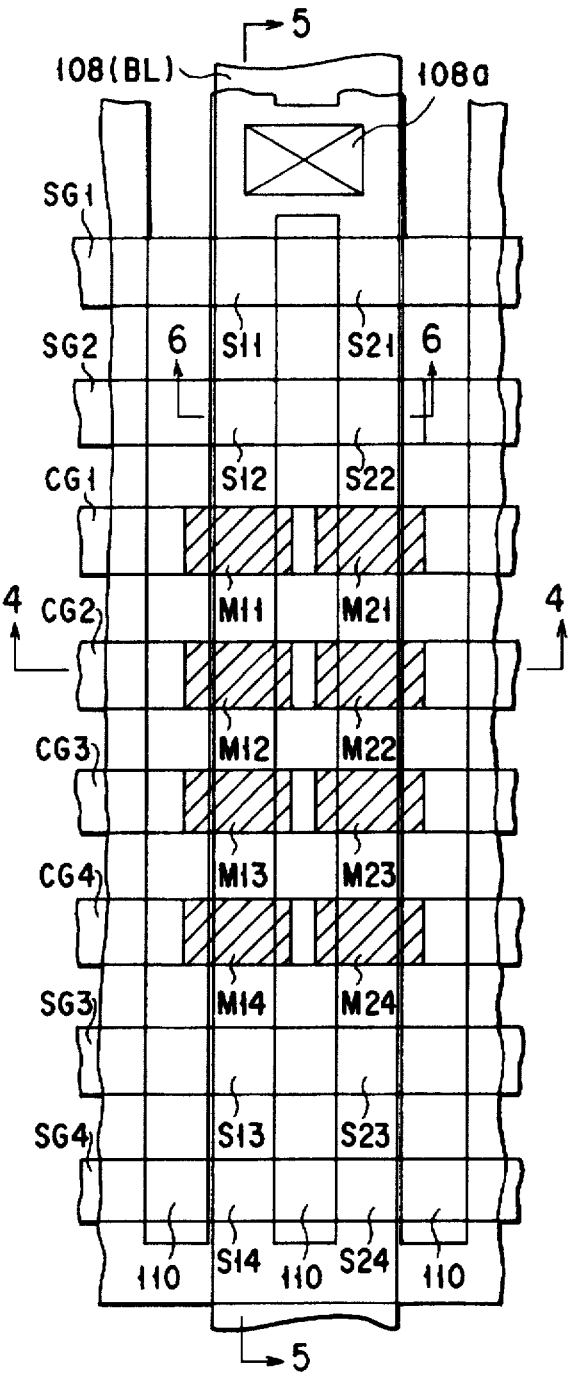
FIG. 1 PRIOR ART
FIG. 2

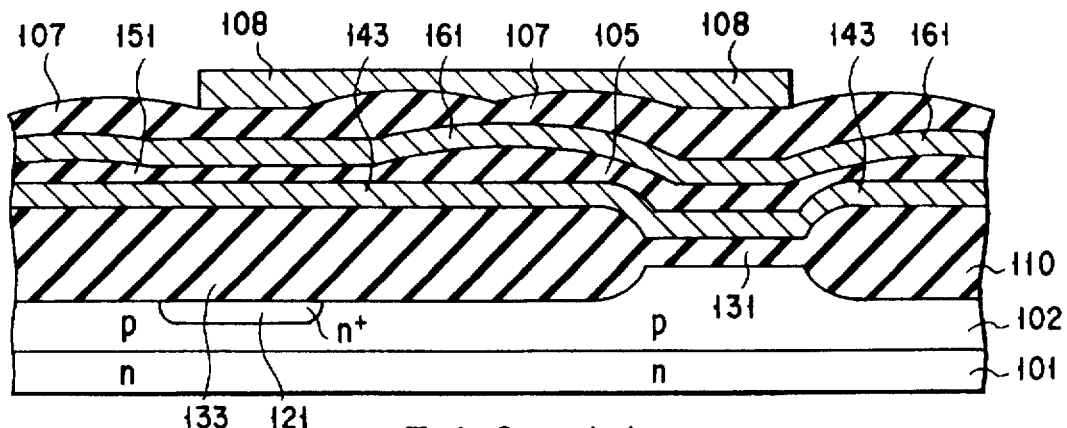
F I G. 11
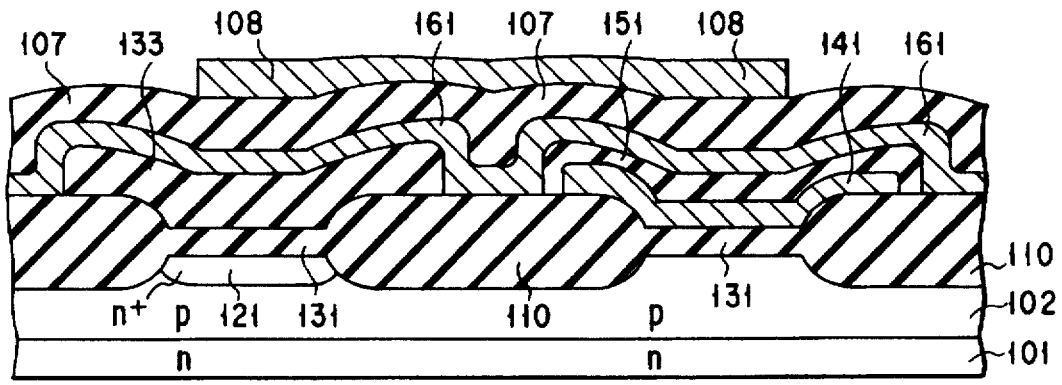
F I G. 12
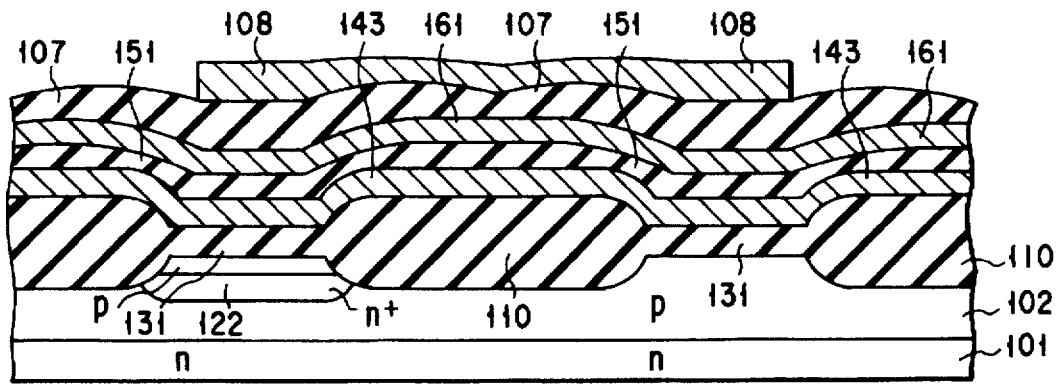
F I G. 13

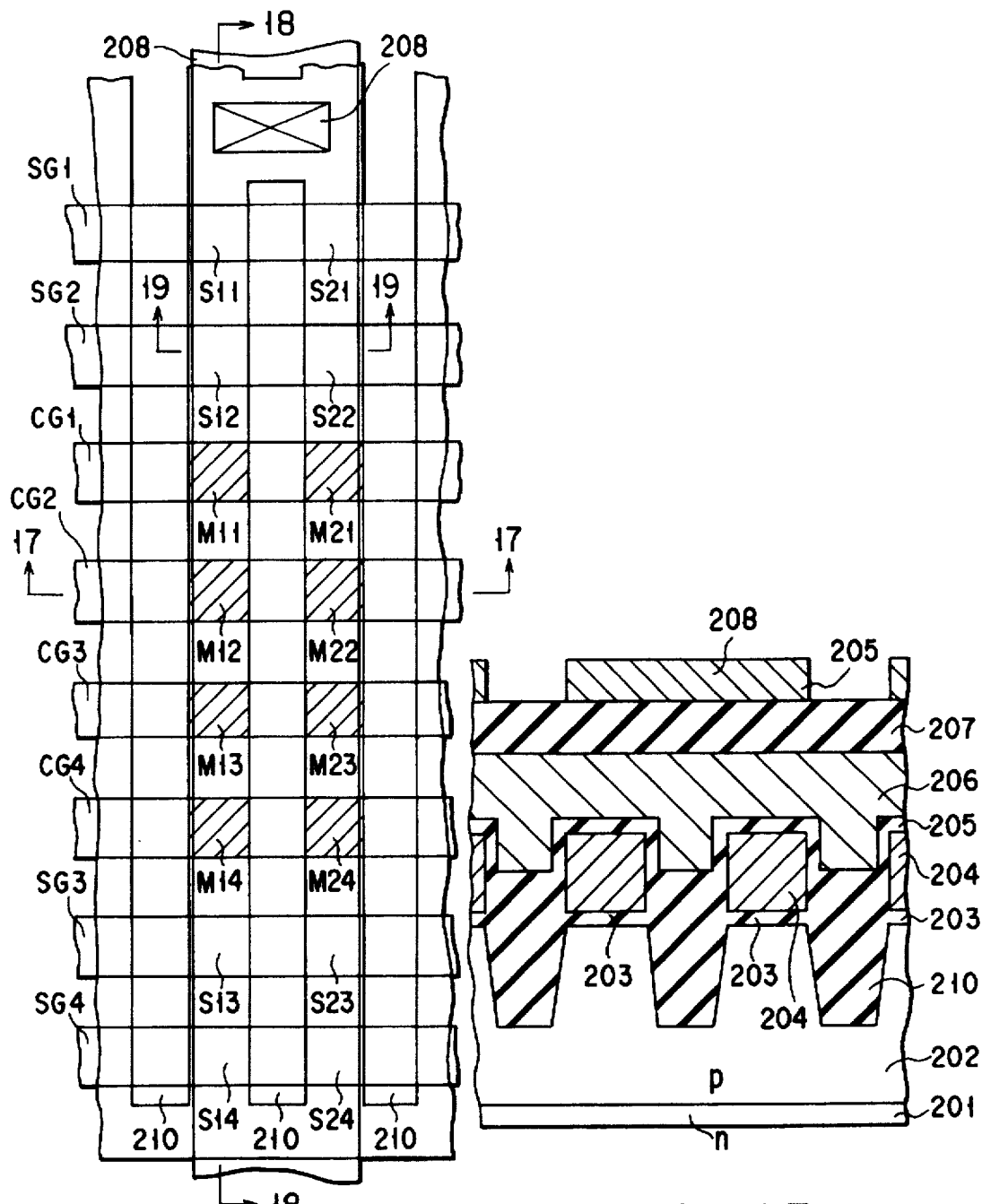
F I G. 16
F I G. 17

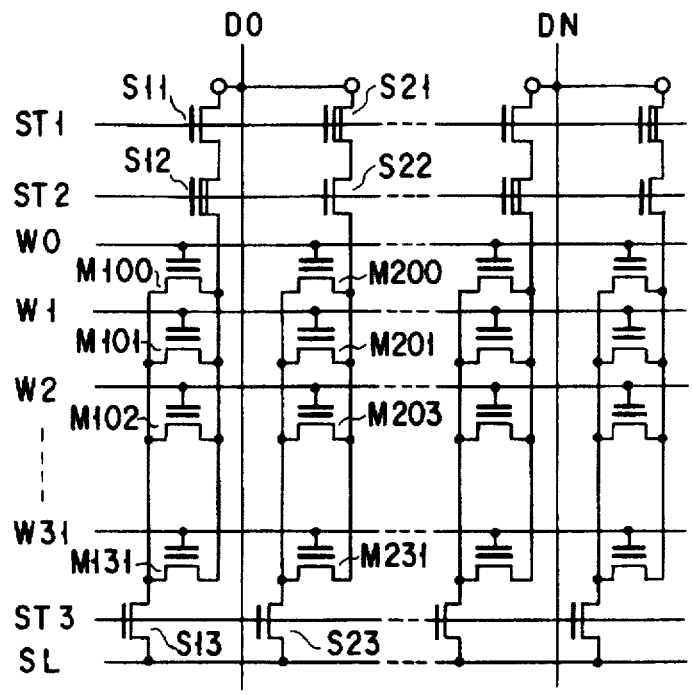
F I G. 27
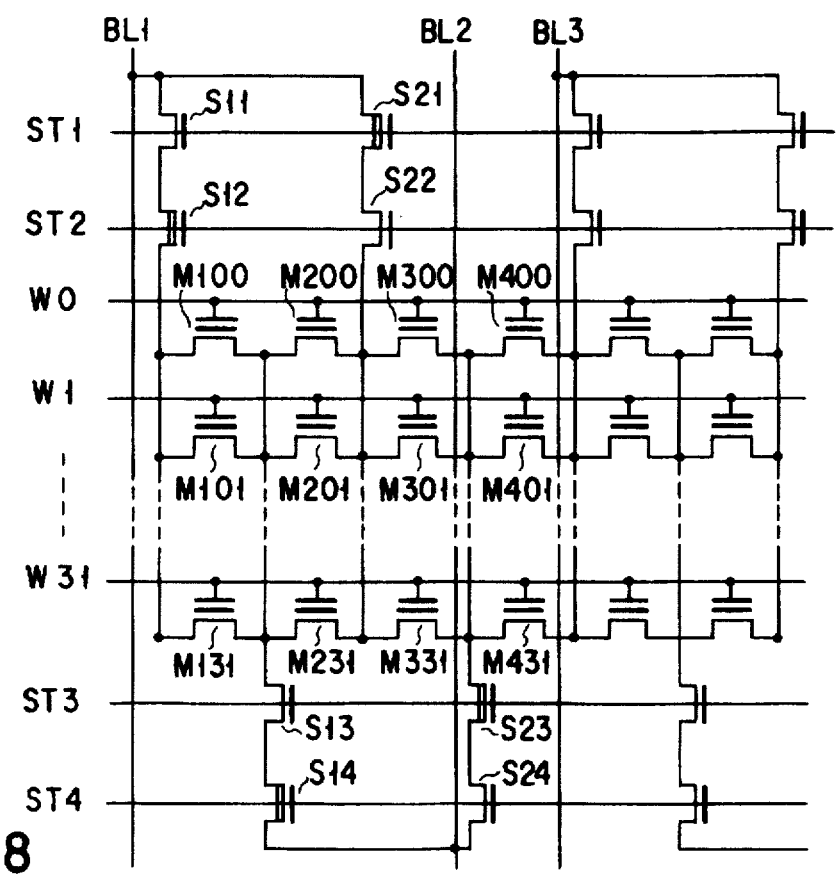
F I G. 28

NONVOLATILE SEMICONDUCTOR MEMORY DEVICE

BACKGROUND OF THE INVENTION

1. Field of the Invention

This invention relates to a nonvolatile semiconductor memory device, and more particularly to a nonvolatile semiconductor memory device where a plurality of MOS transistor memory cells are cascade-connected or parallel-connected and this connection is connected to a select gate to form a memory cell unit.

2. Description of the Related Art

One known electrically rewritable nonvolatile memory device (EEPROM) is such that a plurality of memory cells are grouped into one unit and one end of the unit is connected to a data line, thereby reducing the number of contacts with the data line to achieve high integration. For example, NAND-cell EEPROMs where a plurality of memory cells are connected in series are available. A memory device of this type is constructed in such a manner that a plurality of memory cells are connected in series with their sources and drains shared by adjacent cells and this series connection is treated as one unit and is connected to a bit line. The memory cells generally have an FETMOS structure where a charge storage layer acting as a floating gate and a control gate for selecting a cell are stacked. The memory cell unit is integrated in a p-well formed in an n-type substrate. The drain side of a NAND cell is connected to a bit line (data line) via a select transistor and its source side is connected to a source line (reference potential wire) via a select transistor. The control gates of the memory cells, arranged on a same row of a plurality of memory cell units adjacent to each other, are connected to a word line one after another.

The bit lines are formed above the memory cell unit with an insulating film interposed therebetween so as to cross at right angles to the control gates. With a trend toward higher integration, the size of a unit cell is getting smaller, making it difficult to secure the areas where the bit lines are in contact with the memory cell unit. To overcome this problem, a method has been proposed which causes a plurality of adjacent memory cell units in a direction of word lines to be connected to the same bit lines and uses a plurality of select transistors connected to the corresponding memory cell units to select a given memory cell unit.

FIG. 1 is a schematic plan view of the memory cell section of a NAND-cell EEPROM of this type. FIG. 1 shows a NAND cell in which eight memory cells $M_{11}$ to $M_{24}$ and eight select transistors $S_{11}$ to $S_{24}$ are arranged in two parallel columns. CG1 to CG4 indicate control gate lines, SG1 to SG4 denote select gate lines, numeral 8 represents a bit line (BL) formed above the control gates and select gates with an insulating layer interposed therebetween. Reference symbol 8a indicates a bit-line contact portion where the bit line 8 is electrically connected to the memory cell section. The two columns of memory cell units are separated by an element isolating region 10. The bit line connected to both of the two columns of memory cell units has a sufficient contact area in the contact portion 8a. The shaded portions in memory cells $M_{11}$ to $M_{24}$ indicate floating-gate formation areas.

Of the eight select transistors, $S_{11}$, $S_{14}$, $S_{22}$, and $S_{23}$ are enhancement-mode transistors and $S_{12}$, $S_{13}$, $S_{21}$, and $S_{24}$ are depletion-mode transistors. They are designed so that either column may be selected by a select gate signal.

In this example, each NAND-cell column has two select transistors on the bit-line side and another two select transistors on the source-line side, the pairs of transistors being combinations of an enhancement-mode transistor and a depletion-mode transistor. The arrangement is designed so that either NAND-cell column can be selected by controlling the voltages of SG1 and SG2 according to a specific combination of high-level and low-level voltages.

An attempt to operate this type of EEPROM at high speeds, however, causes the following problem. In FIG. 1, for example, it is assumed that the voltage of bit line is 5 V, the voltage of select gate line SG1 is 0 V, the voltage of select gate line SG2 is 5 V, and then enhancement-mode transistor $S_{22}$ is turned on, selecting the right NAND column. At this time, a parasitic capacitance between the channel portion and select gate electrode of the right-side depletion-mode transistor $S_{21}$ connected to SG1 is so large that coupling with the bit-line voltage of 5 V develops, raising the voltage of SG1 from 0 V. The rise in the voltage of SG1 turns on the left-side enhancement-mode transistor $S_{11}$ connected to SG1, permitting the left NAND column to be selected as well. This makes stable high-speed operation impossible.

Such a problem will also occur in the case where adjacent memory cell units commonly use a bit line such as in an AND type EEPROM or in a DINOR type EEPROM, in which the memory cell units are connected in parallel along the bit line, each being comprised of a plurality of memory cells connected in parallel.

As described above, with the conventional nonvolatile semiconductor memory devices, the coupling capacitance in the select transistor section prevents stable operation and consequently hinders higher-speed operation.

SUMMARY OF THE INVENTION

The object of the present invention is to provide a nonvolatile semiconductor memory device which can reduce a parasitic capacitance in the select transistors substantially, and achieve more stable, higher-speed operation.

The gist of the present invention is to reduce a parasitic capacitance in the select transistors connected to the memory cell unit and thereby achieve stable, high-speed operation.

A nonvolatile semiconductor memory device according to a first aspect of the present invention comprises:

a semiconductor substrate with a main surface;

a plurality of memory cell units formed on the main surface of the semiconductor substrate, each of the memory cell units having a plurality of memory cells connected in one unit, each of the memory cells containing a first charge accumulation layer formed on the main surface of the semiconductor substrate in an insulating manner, a first control gate formed on the first charge accumulation layer in an insulating manner, and two first diffusion layers formed at the main surface of the semiconductor substrate on both side of the first charge accumulation layer, at least one of the two first diffusion layers being shared by adjacent one of the memory cells, thereby connecting the memory cells adjacent to each other;

a plurality of first select transistors connected to one end of each of the plurality of memory cell units via one of the first diffusion layers located at the one end, each of the plurality of first select transistors containing a second control gate and a source and a drain region and being connected in series by adjacent one of the first select transistors sharing one of the source and the drain region, the second control gate being connected to each of a plurality of select gate lines, at least one of the plurality of first select transistors further containing a second charge accumulation layer on the main surface of the semiconductor substrate and under the second control gate in an insulating manner; and a data line connected to at least two adjacent ones of the memory cell units via the plurality of first select transistors.

A nonvolatile semiconductor memory device according to a second aspect of the present invention comprises:

a semiconductor substrate with a main surface;

a plurality of memory cell units formed on the main surface of the semiconductor substrate, each of the memory cell units having a plurality of memory cells connected in one unit, each of the memory cells containing a first charge accumulation layer formed on the main surface of the semiconductor substrate in an insulating manner, a first control gate formed on the charge accumulation layer in an insulating manner, and two first diffusion layers formed at the main surface of the semiconductor substrate on both side of the charge accumulation layer, at least one of the first diffusion layers being shared by adjacent one of the memory cells, thereby connecting the memory cells adjacent to each other;

a plurality of first select transistors connected to one end of each of the plurality of memory cell units via one of the diffusion layers located at the one end, each of the plurality of first select transistors containing a gate insulating film formed on the main surface of the semiconductor substrate, a second control gate formed on the gate insulating film, and a source and a drain region formed at the main surface of the semiconductor substrate on both side of the second control gate, at least one of the source and the drain region being shared by adjacent one of the select transistors and connecting the adjacent one of the select transistors in series, the second control gate being connected to a corresponding one of a plurality of control gate lines, and the gate insulating film of at least one of the first select transistors being made thicker than the gate insulating film of another one of the first select transistors; and a data line connected to at least two adjacent ones of the memory cell units via the plurality of first select transistors.

A nonvolatile semiconductor memory device according to a third aspect of the present invention comprises:

a semiconductor substrate with a main surface;

a plurality of memory cell units formed on the main surface of the semiconductor substrate, each of the memory cell units having a plurality of memory cells connected in one unit, each of the memory cells containing a first charge accumulation layer formed on the main surface of the semiconductor substrate in an insulating manner, a first control gate formed on the charge accumulation layer in an insulating manner, and two first diffusion layers formed at the main surface of the semiconductor substrate on both side of the charge accumulation layer, at least one of the two first diffusion layers being shared by adjacent one of the memory cells, thereby connecting the memory cells adjacent to each other;

a plurality of first select transistors connected to one end of each of the plurality of memory cell units via one of the diffusion layers located at the one end, each of the plurality of first select transistors containing a second control gate formed on the main surface of the semiconductor substrate in an insulating manner, and a source and a drain region formed at the main surface of the semiconductor substrate on both side of the second control gate, at least one of the source and the drain region being shared by adjacent one of the first select transistors and connecting the adjacent one of the memory cells in series, the second control gate being connected to a corresponding one of a plurality of control gate lines, and at least one of the plurality of first select transistors having a second diffusion layer of a same conductivity type as that of the source and the drain region in the semiconductor substrate, the second diffusion layer being electrically connected to the source and the drain region; and a data line connected to at least two adjacent ones of the memory cell units via the plurality of first select transistors.

With a nonvolatile semiconductor memory device of the present invention, the parasitic capacitance at the select gate electrodes is reduced by providing the depletion-mode select transistors with floating gates, virtually making the gate insulating film thicker, or providing under the gate insulating film a channel layer that is of the same conductivity type as that of the source and drain regions and connects the source and drain regions. This enables the potential of the select gates to be almost fixed at a desired value, preventing a faulty operation and making it possible to cause the select transistors to operate at high speed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a plan view of a memory cell unit in an ordinary NAND-cell EEPROM;

FIG. 2 is a plan view of a memory cell unit in a NAND-cell EEPROM according to the present invention;

FIG. 11 is a sectional view of a select transistor in a NAND-cell EEPROM according to a fourth embodiment of the present invention, taken along line 6—6 of FIG. 2;

FIG. 12 is a sectional view of a select transistor in a NAND-cell EEPROM according to a fifth embodiment of the present invention, taken along line 6—6 of FIG. 2;

FIG. 13 is a sectional view of a select transistor in a NAND-cell EEPROM according to a sixth embodiment of the present invention, taken along line 6—6 of FIG. 2;

FIG. 16 is a plan view of a memory cell unit in the case where a trench element isolating region is formed by self-alignment;

FIG. 17 is a sectional view of a memory cell section in the NAND-cell EEPROM according to the present invention, taken along line 17—17 of FIG. 16;

FIG. 27 is an equivalent circuit diagram of a memory cell unit in a DINOR type EEPROM according to a fourteenth embodiment of the present invention; and FIG. 28 is an equivalent circuit diagram of a memory cell unit in a AND type EEPROM according to a fifteenth embodiment of the present invention.

DETAILED DESCRIPTION OF THE PREFERRED EMBODIMENTS

Hereinafter, referring to the accompanying drawings, embodiments of the present invention will be explained.

Figure 3:
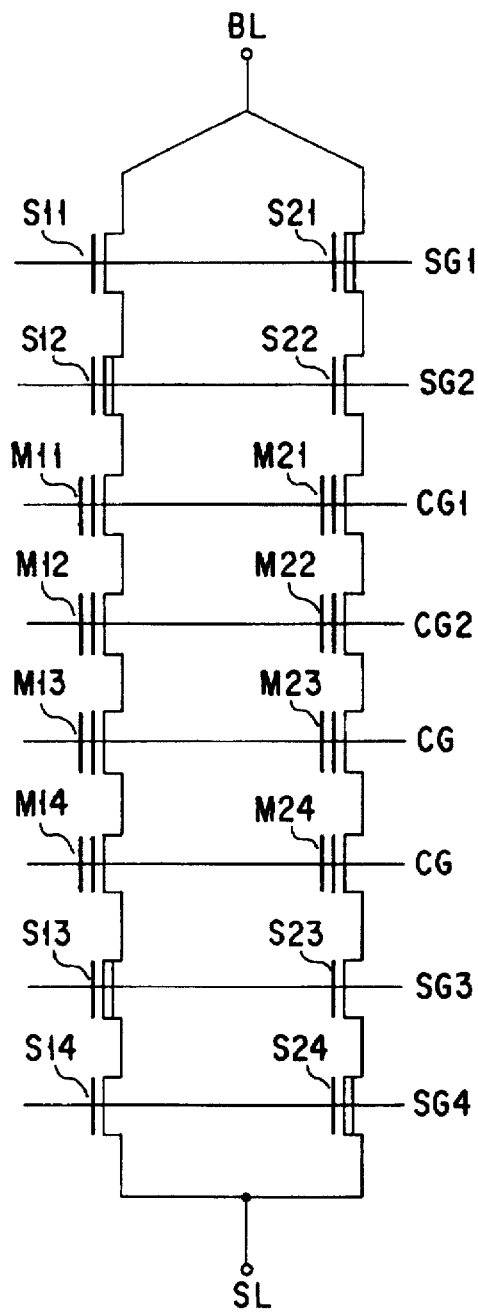
FIG. 3 is an equivalent circuit diagram of a memory cell unit in a NAND-cell EEPROM according to the present invention.

FIGS. 2 and 3 show a schematic structure and an equivalent circuit of a memory cell section common to embodiments of the present invention, respectively. FIG. 2 shows a NAND cell in which eight memory cells $M_{11}$ to $M_{24}$ and eight select transistors $S_{11}$ to $S_{24}$ are arranged in two parallel columns. CG1 to CG4 indicate control gate lines, SG1 to SG4 denote select gate lines, numeral 108 represents a bit line (BL) formed above the control gates and select gates with an insulating layer interposed therebetween. Reference symbol 108a indicates a contact portion where the bit line 108 is electrically connected to the NAND cell and 110 denotes an element isolating region.

As shown in the equivalent circuit of FIG. 3, select transistors $S_{11}$, $S_{14}$, $S_{22}$, $S_{23}$ are enhancement-mode transistors, and transistors $S_{12}$, $S_{13}$, $S_{21}$, $S_{24}$ are depletion-mode transistors. These transistors are used to select either NAND cell column.

In a first to sixth embodiments, the element isolating region 110 is formed of a thick field oxide film.

Figure 4:
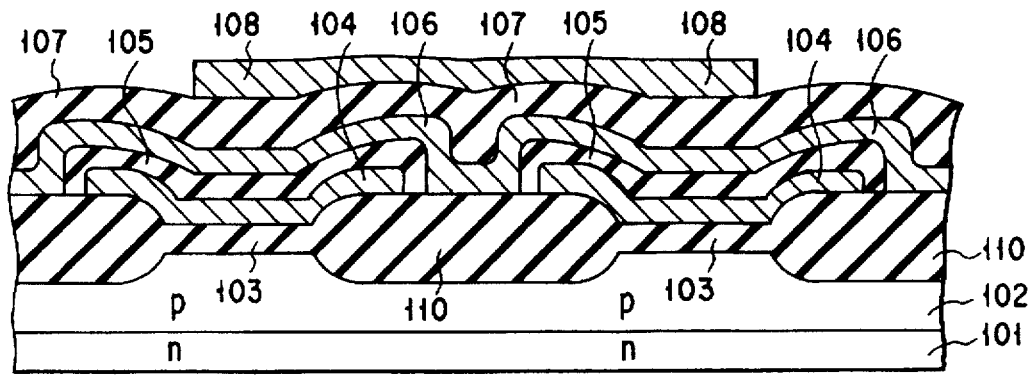
FIG. 4 is a sectional view of a memory cell section in the NAND-cell EEPROM of the present invention, taken along line 4—4 of FIG. 2.

FIG. 4 is a sectional view of a memory cell section, taken along line 4—4 of FIG. 2. In the region sandwiched between the element isolating films 110 at the top of a p-well 102 provided in an n-type substrate 101, a first gate insulating film 103 is formed. On the first gate insulating film, a floating gate (charge accumulation layer) 104, a second gate insulating film 105, and a control gate 106, and an interlayer insulating film 106 are formed in that order. A bit line 108 is formed on the interlayer insulating film 107 so as to cover both of the two columns of memory cells. An element isolation insulating film 110 corresponds to the element isolating region 110 of FIG. 1.

The present invention is characterized by the configuration of select transistors $S_{11}$ to $S_{14}$, which will be described using the following embodiments.

(Embodiment 1)

Figure 5:
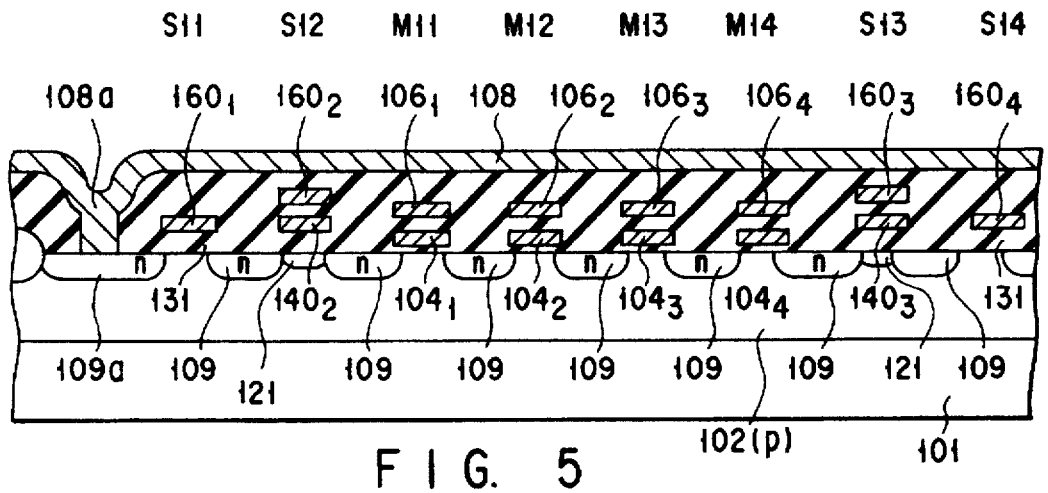
FIG. 5 is a sectional view of a memory cell unit in a NAND-cell EEPROM according to a first embodiment of the present invention, taken along line 5—5 of FIG. 2.
Figure 6:
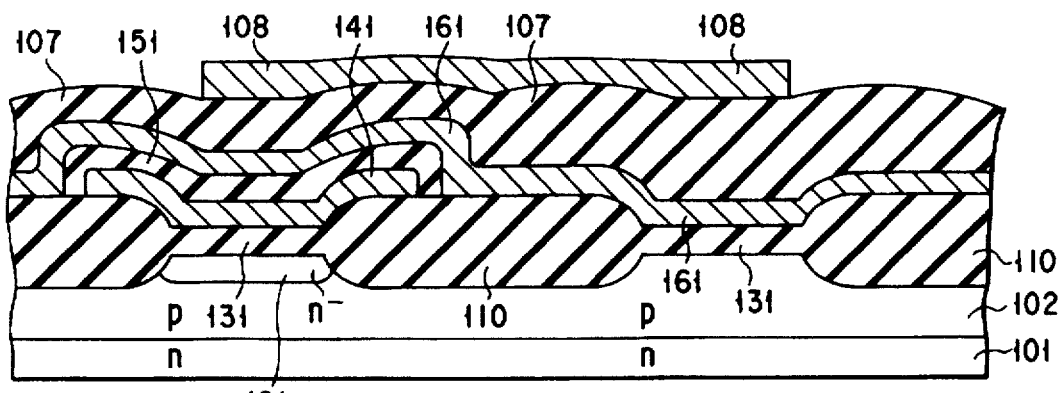
FIG. 6 is a sectional view of a select transistor in the NAND-cell EEPROM according to the first embodiment of the present invention, taken along line 6—6 of FIG. 2.

FIGS. 5 and 6 are sectional views of a NAND-cell EEPROM according to a first embodiment of the present invention, taken along line 5—5 and line 6—6 of FIG. 2, respectively.

FIG. 5 shows part of a p-well 102 formed in an n-type silicon substrate 101. Memory cells $M_{11}$ to $M_{14}$ constituting a NAND cell are such that floating gates 104 ($104_1$ to $104_4$) are formed of a polysilicon film above the p-well 102 with a first gate insulating film interposed therebetween and further above the floating gates, control gates 106 ($106_1$ to $106_4$) are formed of polysilicon via a second gate insulating film, with the n-type diffusion layers 109 in the p-well 102 serving as sources and drains. The control gates 106 of the individual memory cells are formed consecutively in the row direction to provide word lines (CG1 to CG4 in FIG. 2). Between the memory cells, the n-type diffusion layers 109 to serve as sources and drains are formed and connected in series so that the source and drains may be shared by adjacent cells, thereby forming a NAND cell.

In the select transistors $S_{12}$, $S_{13}$, floating gates (charge accumulation layers) $140_2$, $140_3$ are formed of a polysilicon film above the p-well 102 with a third gate insulating film thicker than the first gate insulating film interposed therebetween. Thereon, control gates $160_2$, $160_3$ are formed of a polysilicon film with a fourth gate insulating film interposed therebetween. The floating gates 140 and control gates 160 are formed at the same time when the floating gates 104 and control gates 106 in the memory cell section are formed, respectively. The n-type diffusion layers 109 formed on both sides of the floating gates are determined to be the source and drain regions, thereby forming transistors.

The select transistors $S_{11}$, $S_{14}$ have only control gates $160_1$, $160_4$ formed above the p-well 102 with the third gate insulating film interposed therebetween as gate electrodes. The control gates $160_1$, $160_4$ are also formed at the same time that the control gates 106 in the memory cell section are formed.

A bit-line contact 108a is connected to an n-type diffusion layer 109a (bit-line diffusion layer) formed at the same time that the n-type diffusion layers 109 are formed.

FIG. 6 is a sectional view taken along line 6—6 of FIG. 2. In the figure, two select transistors formed in the p-well on the n-type substrate 101 are shown. The portions of the first gate insulating films 131 separated by element isolating regions 110 are the select transistor formation regions. The first gate insulating films 131 are formed of a thermal oxide film of silicon (a dielectric constant of 3.9) to a thickness of, for example, 25 nm.

The select transistor at the left of the figure is a depletion-mode transistor, where an n⁻ diffusion layer 121 is formed directly under the first gate insulating film 131. In the transistor, a floating gate 141 of polysilicon is formed to a thickness of 200 nm on the first gate oxide film 131, and a select gate electrode 161 of polysilicon is formed to a thickness of 300 nm via a second gate oxide film 151 (of a thickness of 25 nm) formed of an ONO (Oxide-Nitride-Oxide) film (a dielectric constant of 5.0). Since the gate electrode 161 sandwiches the floating gate 141 interposing the first gate insulating film (25 nm) and the second gate insulating film (25 nm) between itself and the n⁻ diffusion layer 121, the virtual gate insulating film can be made about twice as thick as the right-side transistor, thereby reducing a parasitic capacitance viewed from the gate electrode 161.

The n⁻ diffusion layer 121 is formed by ion-implanting, for example, As to a concentration of $1 \times 10^{18}$ atoms/cm³ and connected to the source and drain regions 109, before the first gate insulating film 131 is formed. As a result, the transistor is always on. The transistor in that condition is the same as a resistor. Because of ease of manufacturing, such transistor form is used.

The right-side transistor is an enhancement-mode transistor, where the gate electrode 161 extends and directly contacts the first gate oxide film 131. On the gate electrode 161, the interlayer insulating film 107 is formed, on which the bit line 108 is further formed of an aluminium wire.

The interlayer insulating film 107 is a $SiO_2$ film (a dielectric constant of 3.9) or a BPSG film formed by CVD techniques. The insulating film is made as thick as 1000 nm in the left-side depletion-mode transistor portion as well. Therefore, the coupling capacitance between the gate electrode 161 and the bit line 108 is so small that it can be ignored, as compared with the coupling capacitance between the bit-line diffusion layer 109a and the gate electrode 161, formed via an n⁺ diffusion layer 121.

Figure 7:
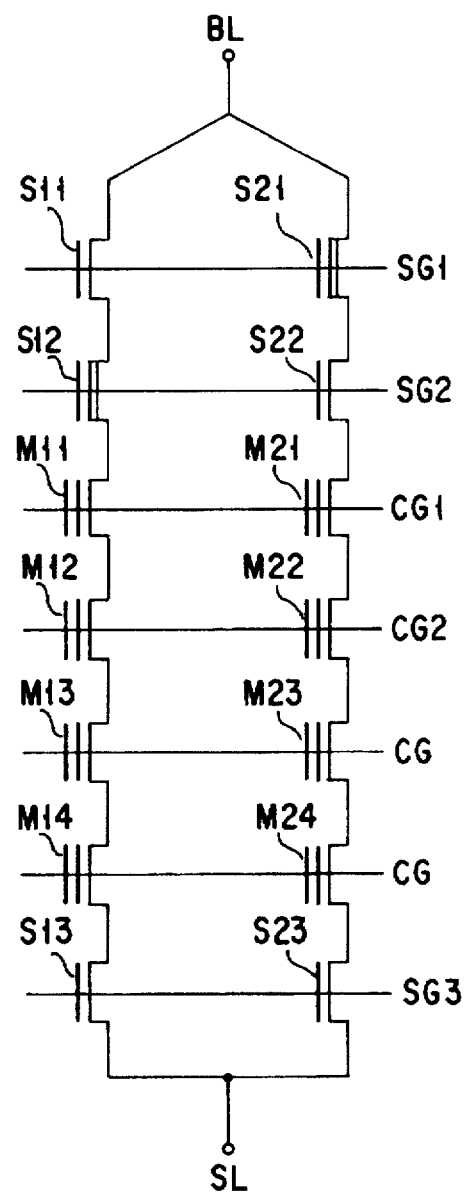
FIG. 7 is an equivalent circuit diagram of another memory cell unit according to the present invention.

With the above configuration, the capacitance between the bit-line diffusion layer 109a and the select gate electrode 161 decreases, thereby suppressing fluctuations in the potential of the select gate due to the capacitive coupling. While in the embodiment, the thickness of the first gate oxide film is the same in both of the right and left transistors, the gate oxide film may be formed so as to have a different thickness between the enhancement-mode type and the depletion-mode type. Furthermore, the pair of select transistors on the source-line (SL) side, $S_{13}+S_{14}$ or $S_{23}+S_{24}$ may be replaced with a single enhancement-mode transistor as shown by the equivalent circuit in FIG. 7, whereby either memory cell unit can be selected.

Hereinafter, a second to sixth embodiments of the present invention will be explained. The basic configuration of the memory cell section in these embodiments is the same as that in FIG. 4 except for the configuration of the select transistor. Thus, in the embodiments explained below, only the select transistor portion will be described. Except for the specially described parts, the parts indicated by the same reference numerals are formed of the same material, in the same dimensions, and by the same manufacturing method.

(Embodiment 2)

Figure 8:
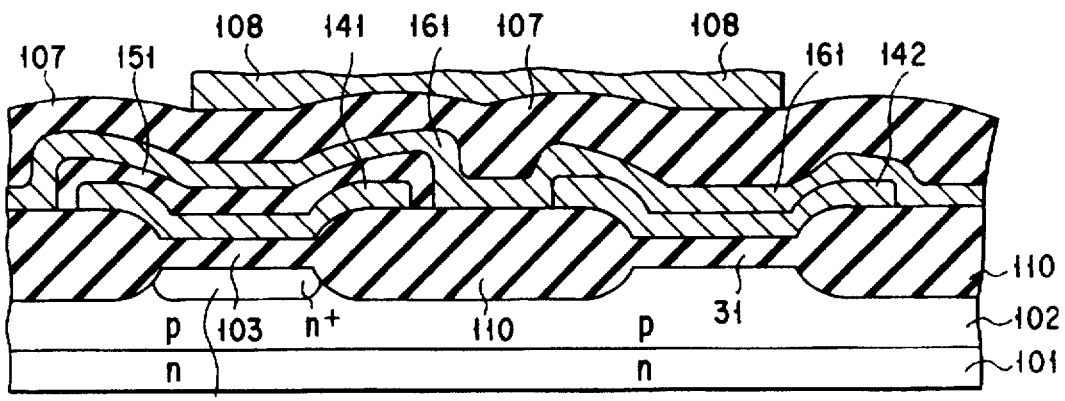
FIG. 8 is a sectional view of a select transistor in a NAND-cell EEPROM according to a second embodiment of the present invention, taken along line 6—6 of FIG. 2.

A NAND-cell EEPROM according to a second embodiment of the present invention will be described with reference to FIG. 8. FIG. 8 corresponds to the sectional view of FIG. 6 in the first embodiment. The same parts as those in FIG. 6 are indicated by the same reference numerals and a repeated explanation of them will not be given. In the second embodiment, the configuration of the left-side depletion-mode transistor is the same as that in the first embodiment and the gate electrode of the right-side enhancement-mode transistor is such that an electrode 142 formed at the same time that the floating gates 141 of the depletion-mode transistors is electrically brought into contact with the select electrode 161 and then stacked. With this configuration, the capacitance between the bit line 108 (or the bit-line diffusion layer 109a) and the select gate electrode 161 decreases, thereby suppressing fluctuations in the potential of the select gate due to the capacitive coupling.

(Embodiment 3)

Figure 9:
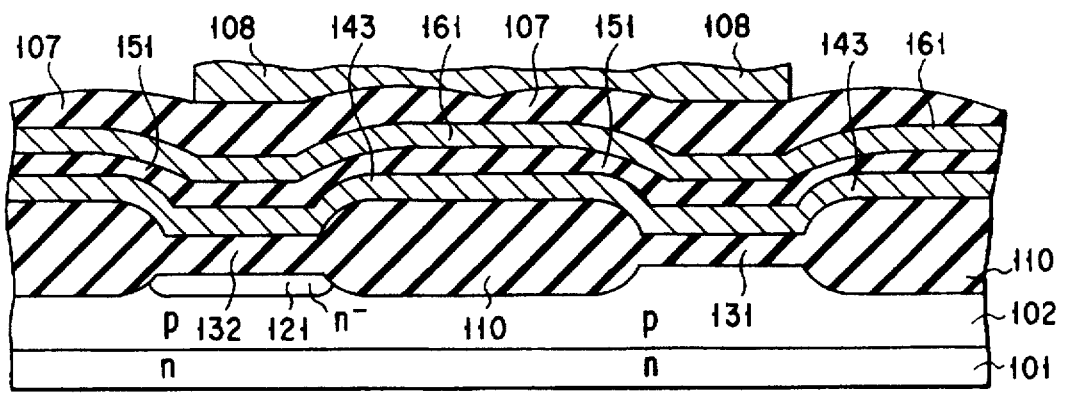
FIG. 9 is a sectional view of a select transistor in a NAND-cell EEPROM according to a third embodiment of the present invention, taken along line 6—6 of FIG. 2.
Figure 10:
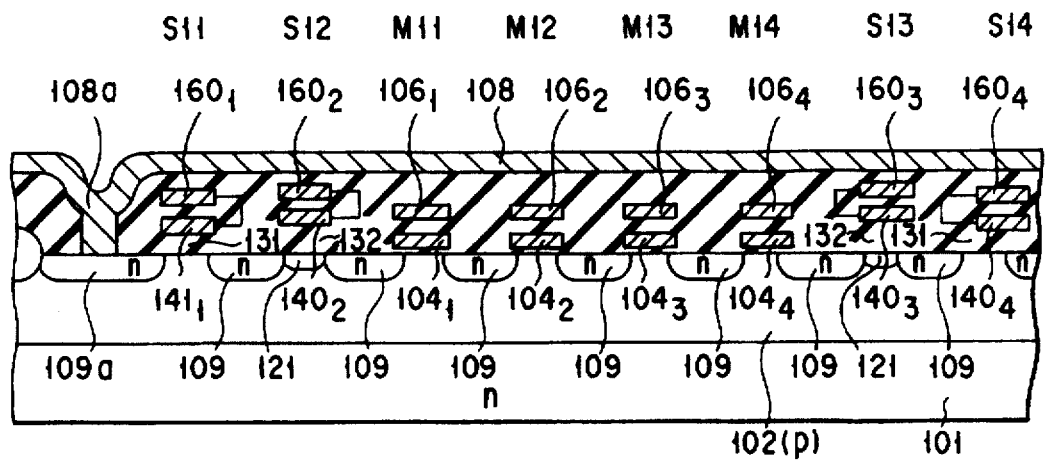
FIG. 10 is a sectional view of a memory cell unit in the NAND-cell EEPROM according to the third embodiment of the present invention, taken along line 5—5 of FIG. 2.

A NAND-cell EEPROM according to a third embodiment of the present invention will be described with reference to FIGS. 9 and 10. FIGS. 9 and 10 correspond to the sectional views of FIG. 6 and 5 in the first embodiment, respectively. The same parts as those in FIGS. 5 and 6 are indicated by the same reference numerals and a repeated explanation of them will not be given. In the third embodiment, the thickness of the first gate insulating film 131 of the right-side enhancement-mode transistor of FIG. 9 is 25 nm, whereas the first gate insulating film 132 of the left-side depletion-mode transistor is made as thick as 50 nm. Directly under the first gate insulating film 132 of the left-side transistor, an n⁻ diffusion layer 121 is formed. On the first gate insulating films 131, 132, a first gate electrode (of a thickness of 200 nm) of polysilicon, a second gate insulating film 151 (of a thickness of 25 nm) made of an ONO film, and a second gate electrode 161 (of a thickness of 300 nm) of polysilicon are formed in that order. The first gate electrode 143 is in contact with the second gate electrode 161 in a not-shown place to become a select gate line (In FIG. 10, to make it easy to understand, the two electrodes are connected with a line, but they are actually not connected in that place). Further by forming an interlayer insulating film 107 (of a thickness of 1000 nm) by CVD techniques and a bit line 108 on the select gate, the select transistor portion is constructed. With this configuration, the capacitance between the select gate 161 and the n⁺ diffusion layer 121 decreases, thereby suppressing fluctuations in the potential of the select gate due to the capacitive coupling.

(Embodiment 4)

A NAND-cell EEPROM according to a fourth embodiment of the present invention will be described with reference to FIG. 11. FIG. 11 corresponds to the sectional view of FIG. 6 in the first embodiment. The same parts as those in FIG. 6 are indicated by the same reference numerals and a repeated explanation of them will not be given. In the fourth embodiment, the gate oxide film 133 of the left-side depletion-mode transistor is formed of an element isolation insulating film (of a thickness of 500 nm). The bit-line diffusion layer 109a is approximately connected to the n-type diffusion layer 109 in the memory cell by means of an n⁺ diffusion layer 121 directly under the gate insulating film 133. With this configuration, the capacitance between the select gate 161 and the n⁺ diffusion layer 121 decreases, thereby suppressing fluctuations in the potential of the select gate due to the capacitive coupling.

(Embodiment 5)

A NAND-cell EEPROM according to a fifth embodiment of the present invention will be described with reference to FIG. 12. FIG. 12 corresponds to the sectional view of FIG. 6 in the first embodiment. The same parts as those in FIG. 6 are indicated by the same reference numerals and a repeated explanation of them will not be given. In the fifth embodiment, a SiO₂ insulating film 133 is further deposited on the gate oxide film 131 of the depletion-mode transistor to a thickness of, for example, 300 nm by CVD techniques, whereby the gate capacitance of the depletion-mode select transistor is reduced. With this configuration, the capacitance between the select gate 161 and the n⁺ diffusion layer 121 decreases, thereby suppressing fluctuations in the potential of the select gate due to the capacitive coupling.

(Embodiment 6)

Figure 14:
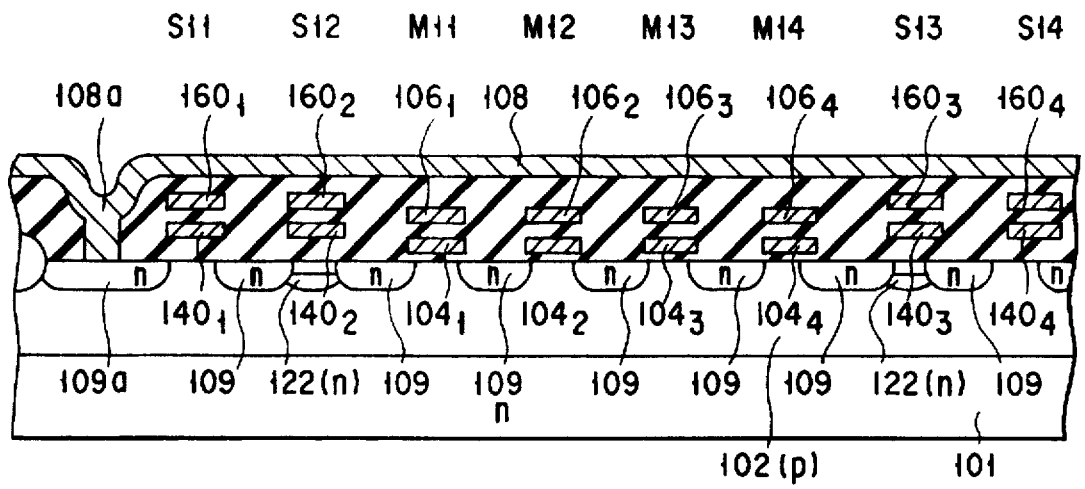
FIG. 14 is a sectional view of a memory cell unit in the NAND-cell EEPROM according to the sixth embodiment of the present invention, taken along line 5—5 of FIG. 2.

A NAND-cell EEPROM according to a sixth embodiment of the present invention will be described with reference to FIGS. 13 and 14. FIGS. 13 and 14 correspond to the sectional views of FIG. 6 and 5 in the first embodiment, respectively. The same parts as those in FIGS. 5 and 6 are indicated by the same reference numerals and a repeated explanation of them will not be given. In FIG. 13, in the substrate, for example, 100 nm below the gate oxide film 131 of the depletion-mode transistor, an n⁺ diffusion layer 122 is formed, bringing a portion directly under the gate oxide film 131 into the p-type. The n⁺ diffusion layer 122 is formed by a similar method to that by which the n⁺ diffusion layer 121 is formed in the first embodiment. Specifically, As is ion-implanted at an acceleration voltage of, for example, 200 KeV to control the As concentration to, for example, 1×10¹⁸ atoms/cm³. Then, the diffusion layer 122 is connected to the source and drain regions 109 of the select transistors (FIG. 14). This causes the depletion-mode transistor to always turn on, regardless of the gate voltage. The formation of the n⁺ diffusion layer 122 deep in the substrate causes the distance from the select gate 161 to increase, thereby reducing the capacitance between the select gate 161 and the bit line 108 approximately connected to the source and drain regions 109 via the bit-line contact 108a.

Hereinafter, a seventh to thirteenth embodiments according to the present invention will be explained. The layout and equivalent circuit of these embodiments are the same as those shown in FIGS. 2 and 3 except that the element isolating region is formed by trench isolation and the select transistor is characterized by configuration.

Figure 15:
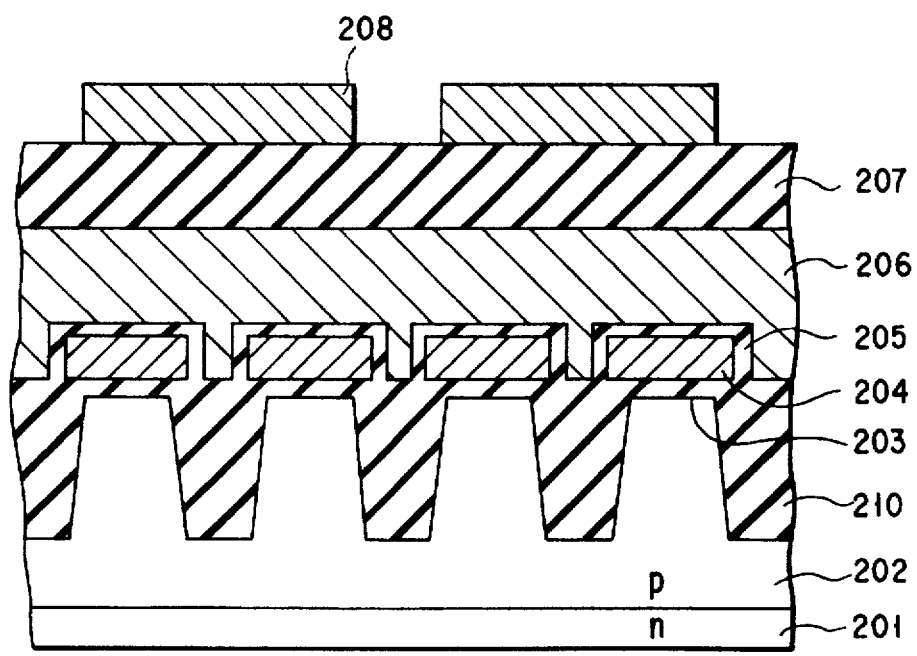
FIG. 15 is a sectional view of an element formation region in the case where trench element isolating techniques are used.

FIG. 15 is a sectional view of memory cells in the case where the element isolating regions are based on trench isolation. In a p-well 202 formed in an n-type substrate 201, element isolating regions 210 of a trench structure are formed, and above the p-well 202 floating gates 204 are formed with a first gate insulating film 203 interposed therebetween. Furthermore, a control gate 206 is formed interposing a second gate insulating film 205 and a bit line 208 is formed interposing an interlayer insulating film 207.

There may be a case where the gate electrodes and trench isolation are formed in a self-aligning manner. FIG. 16 is a plan view of a memory cell unit in such a case. The configuration of FIG. 16 is almost the same as that of FIG. 2 except that the former is characterized in that the shaded portions indicating the floating gate formation regions of memory cells do not extend into the element isolating region 210. Numeral 208 indicates a bit line and 208a a bit-line contact.

FIG. 17 is a sectional view of a memory cell section, taken along line 17—17 of FIG. 16. In the region sandwiched by trench isolating regions 210 at the top of a p-well 202 formed in an n-type substrate 201, a first gate insulating film 203 and a floating gate 204 on the film are formed in a self-aligning manner. Furthermore, a second gate insulating film 205, a control gate 206, and an interlayer insulating film 207 are formed in that order. A bit line 208 is formed on the interlayer insulating film 207 so as to cover two columns of memory cells.

The present invention is characterized by the configuration of the select transistor and the seventh to thirteenth embodiments will be explained, centering on the configuration of the select transistor.

(Embodiment 7)

A NAND-cell EEPROM according to the seventh embodiment of the present invention will be described with reference to FIGS. 18 and 19.

Figures 18, 22:
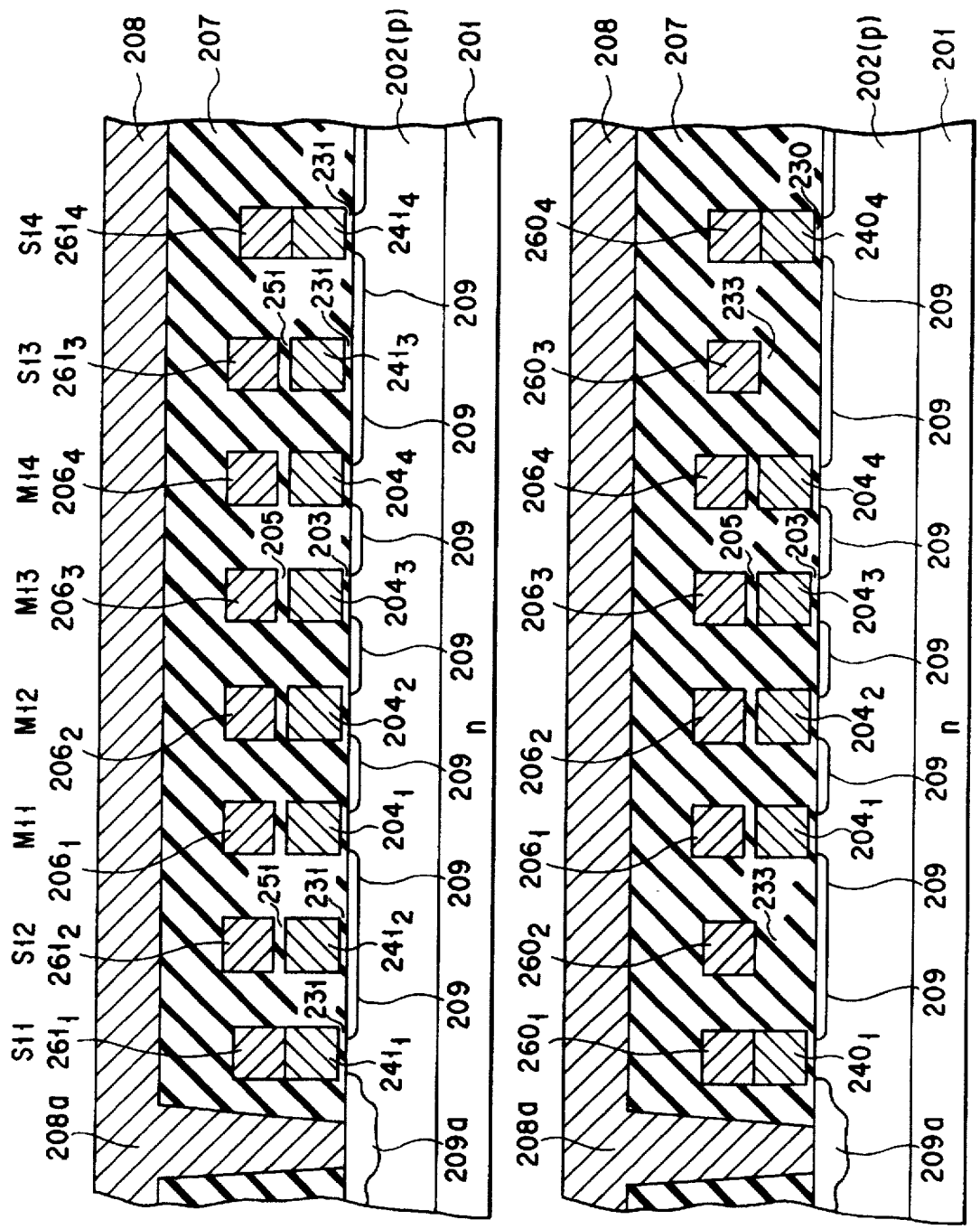
FIG. 18 is a sectional view of a memory cell unit in a NAND-cell EEPROM according to a seventh embodiment of the present invention, taken along line 18—18 of FIG. 16.
FIG. 22 is a sectional view of a memory cell unit in the NAND-cell EEPROM according to the ninth embodiment of the present invention, taken along line 18—18 of FIG. 16.

FIG. 18 is a sectional view of part of the p-well 202 formed in the n-type silicon substrate 201, taken along line 18—18 of FIG. 16. Memory cells $M_{11}$ to $M_{14}$ constituting a NAND cell are such that above the p-well 202, floating gates 204 ($204_1$ to $204_4$) of a polysilicon film are formed with a first gate insulating film 203 interposed therebetween and control gates 206 ($206_1$ to $206_4$) of a polysilicon film are formed interposing a second gate insulating film 205 above the floating gates, with the n-type diffusion layers 209 formed at the surface of p-well 202 serving as the source and drain regions. The control gates 206 of the individual memory cells are formed consecutively in the row direction to produce word lines (CG1 to CG4 in FIG. 16). Between the individual memory cells, the n-type diffusion layers 209 serving as the source and drain regions are formed, and the source and drain regions are connected in series in such a manner that they may be shared by the adjacent cells, thereby forming a NAND cell.

In the select transistors $S_{11}$, $S_{14}$, first gates $241_1$, $242_4$ of a polysilicon film are formed interposing a third gate insulating film 231 above the p-type well 202, and second gates $261_1$, $261_4$ of a polysilicon film are formed directly on the first gates, thus forming stacked select gates.

In the select transistors $S_{12}$, $S_{13}$, first gates $241_2$, $241_3$ of a polysilicon film are formed interposing the third gate insulating film 231 above the p-type well 202, and second gates $261_2$, $261_3$ of a polysilicon film are formed interposing a fourth gate insulating film 251 above these first gates, thus forming stacked select gates.

Numeral 208a indicates a bit-line contact, which is connected to the n-type diffusion layer 209a (bit-line diffusion layer).

Figure 19:
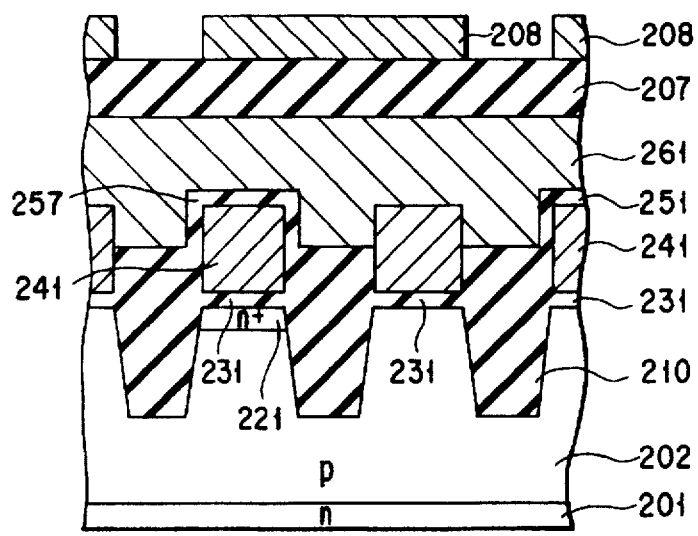
FIG. 19 is a sectional view of a select transistor in the NAND-cell EEPROM according to the seventh embodiment of the present invention, taken along line 19—19 of FIG. 16.

FIG. 19 is a sectional view taken along line 19—19 of FIG. 16, showing two select transistors. Specifically, in the p-well 202 formed in the n-type substrate 201, two select transistors separated by trench isolation 210 are formed. The left-side transistor is a depletion-mode transistor, in which an n⁺ diffusion layer 221 is formed under a first gate insulating film (of a thickness of 25 nm) of a thermal oxide film of silicon. The diffusion layer 221 is formed by, for example, ion-implanting As to a concentration of $2 \times 10^{18}$ atoms/cm³. Furthermore, on the first gate insulating film 231, a floating gate 241 (of a thickness of 400 nm) of polysilicon is formed and a select gate 261 (of a thickness of 300 nm) of polysilicon is formed interposing a second gate insulating film 251 (of a thickness of 25 nm) of an ONO film above the floating gate.

The right-side transistor is an enhancement-mode transistor and is the same as the left-side transistor in that the floating gate 241 is formed on the first gate oxide film 231 and except that the floating gate 241 is directly connected to the select gate 261. On the select gate 261, a SiO₂ interlayer insulating film 207 (of a thickness of 1000 nm) is formed by CVD techniques and a bit line 208 of polysilicon is formed so as to cover two transistors on the interlayer insulating film. The configuration is similar to that in the second embodiment of FIG. 8 and produces a similar effect to that in the second embodiment.

(Embodiment 8)

Figure 20:
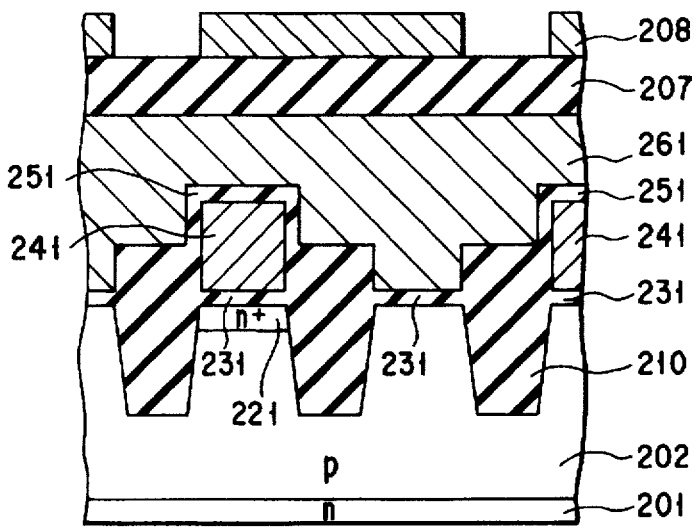
FIG. 20 is a sectional view of a select transistor in the NAND-cell EEPROM according to an eighth embodiment of the present invention, taken along line 19—19 of FIG. 16.

A NAND-cell EEPROM according to an eighth embodiment of the present invention will be described with reference to FIG. 20. FIG. 20 corresponds to the sectional view of FIG. 19 in the seventh embodiment. The same parts as those in FIG. 19 are indicated by the same reference numerals and a repeated explanation of them will not be given. Except for the specially described parts, the parts indicated by the same reference numerals of FIG. 19 are formed of the same material, in the same dimensions, and by the same manufacturing method. The configuration of the eighth embodiment is similar to that of the seventh embodiment, but differs from the latter in that the right-side select transistor has no floating gate and the select gate 261 is formed directly on the first gate oxide film 231. This configuration produces a similar effect to that in the first embodiment.

(Embodiment 9)

Figure 21:
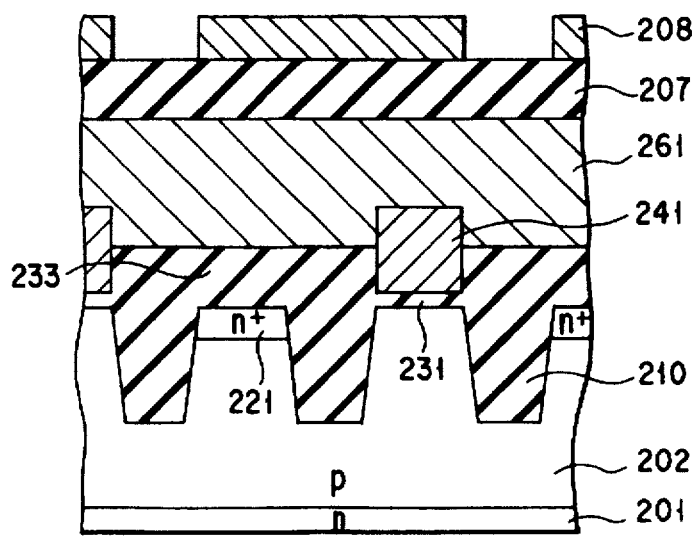
FIG. 21 is a sectional view of a select transistor in a NAND-cell EEPROM according to a ninth embodiment of the present invention, taken along line 19—19 of FIG. 16.

A NAND-cell EEPROM according to a ninth embodiment of the present invention will be described with reference to FIGS. 21 and 22. FIGS. 21 and 22 correspond to the sectional views of FIGS. 19 and 18 in the seventh embodiment, respectively. The same parts are indicated by the same reference numerals and a repeated explanation of them will not be given. With the configuration of the ninth embodiment, the left-side select transistor of FIG. 21 has no floating gate and the select gate 261 is formed above an n⁺ diffusion layer 221 interposing a thick gate insulating film 233 (of a thickness of 200 nm) formed of an embedded insulating film for trench isolation (e.g., a SiO₂ film formed by CVD techniques using TEOS). This configuration can produce a similar effect to that in the fifth embodiment.

(Embodiment 10)

Figure 23:
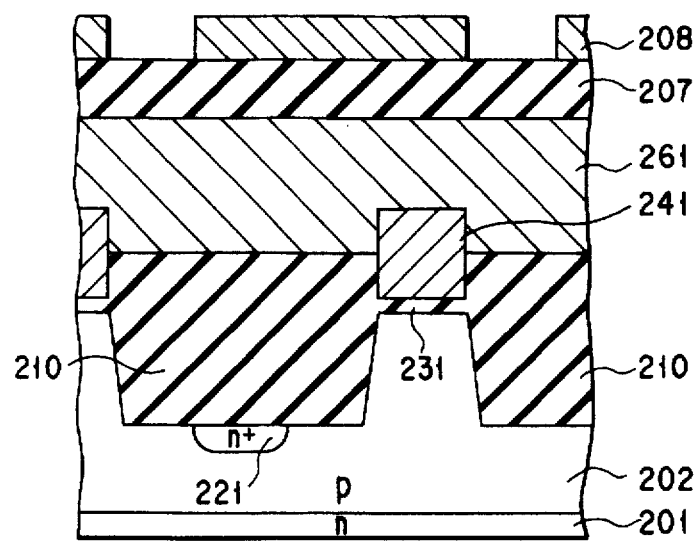
FIG. 23 is a sectional view of a select transistor in a NAND-cell EEPROM according to a tenth embodiment of the present invention, taken along line 19—19 of FIG. 16.

A NAND-cell EEPROM according to a tenth embodiment of the present invention will be described with reference to FIG. 23. FIG. 23 corresponds to the sectional view of FIG. 19 in the seventh embodiment. The same parts as those in FIG. 19 are indicated by the same reference numerals and a repeated explanation of them will not be given. With the configuration of the tenth embodiment, the left-side select transistor has no floating gate but has a thicker gate insulating film 210 (of a thickness of 700 nm) formed of an embedded insulating film for trench isolation between the select gate 261 and the n⁺ diffusion layer 221. This configuration produces a similar effect to that in the fourth embodiment.

(Embodiment 11)

Figure 24:
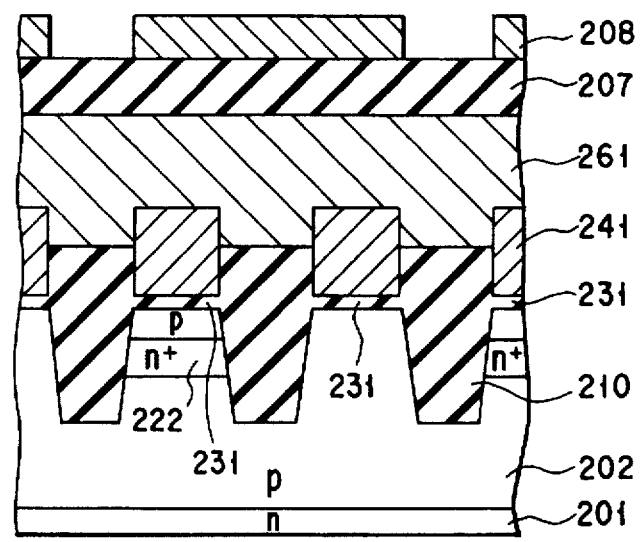
FIG. 24 is a sectional view of a select transistor in a NAND-cell EEPROM according to an eleventh embodiment of the present invention, taken along line 19—19 of FIG. 16.

A NAND-cell EEPROM according to an eleventh embodiment of the present invention will be described with reference to FIG. 24. FIG. 24 corresponds to the sectional view of FIG. 19 in the seventh embodiment. The same parts as those in FIG. 19 are indicated by the same reference numerals and a repeated explanation of them will not be given. In the eleventh embodiment, while in the select transistor, the floating gate 241 is in contact with the select gate 261, in the left-side depletion-mode transistor, an n⁺ diffusion layer 222 is formed in a place, for example, 100 nm below the surface of the channel formation region (p-type layer) sandwiched by trench isolation 210. The n⁺ diffusion layer 222 is formed in the same manner as the n⁺ diffusion layer 221 of FIG. 19, is connected to the source and drain regions of the select transistor, and always is on, regardless of the gate voltage. This configuration produces a similar effect to that in the sixth embodiment.

(Embodiment 12)

Figure 25:
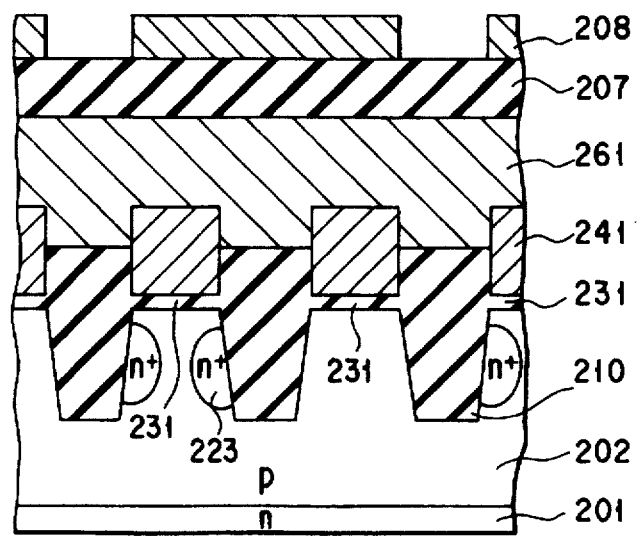
FIG. 25 is a sectional view of a select transistor in a NAND-cell EEPROM according to a twelfth embodiment of the present invention, taken along line 19—19 of FIG. 16.

A NAND-cell EEPROM according to a twelfth embodiment of the present invention will be described with reference to FIG. 25. FIG. 25 corresponds to the sectional view of FIG. 19 in the seventh embodiment. The same parts as those in FIG. 19 are indicated by the same reference numerals and a repeated explanation of them will not be given. In the select transistor of the twelfth embodiment, the floating gate 241 is in contact with the select gate 261, which is similar to the eleventh embodiment. In the twelfth embodiment, an n⁺ layer 223 is formed in the sidewall of the channel formation region (p-type layer) sandwiched by trench isolation 310 in the left-side depletion-mode transistor. The n⁺ layer 223 is formed by ion-implanting As at a concentration of, for example, $1 \times 10^{18}$ atoms/cm³ before the embedded insulating layer for trench isolation is embedded. The diffusion layer 223 is connected to the source and drain regions of the select transistor and is always on, regardless of the gate voltage. This configuration produces a similar effect to that in the sixth embodiment.

(Embodiment 13)

Figure 26A:
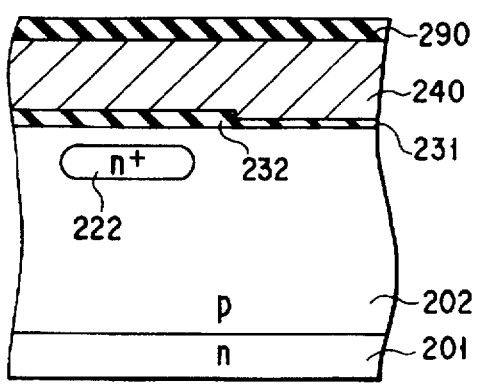
FIGS. 26A to 26E show the manufacturing processes of NAND-cell EEPROMs according to a thirteenth embodiment of the present invention step by step, using sectional views of a select transistor.

Hereinafter, referring to FIGS. 26A to 26E, a NAND-cell EEPROM according to a thirteenth embodiment of the present invention and a method of manufacturing such EEPROMs will be explained. In the thirteenth embodiment, as shown in FIG. 26E, the left-side depletion-mode select transistor has a thick gate insulating film 232 and a floating gate electrode 242, and further an n⁺ diffusion layer 222 formed in the substrate below the gate insulating film 232.

The select transistor is manufactured as follows. As shown in FIG. 26A, for example, As is selectively ion-implanted in a p-well 202 formed in an n-type substrate 201 at, for example, 200 KeV so that the As concentration may be $1 \times 10^{18}$ atoms/cm³, thereby forming an n⁺ diffusion layer 222. Then, the gate insulating film 232 in the left-side transistor portion is formed to a thickness of 50 nm by thermal oxidation, and the gate insulating film 231 in the right-side transistor portion is formed to a thickness of 20 nm so that the left-side gate insulating film may be thicker than the right-side one. On these insulating films, a polysilicon film 240 is formed to a thickness of 400 nm by CVD techniques. Then, a SiO₂ film 290 is formed to a thickness of 200 nm by CVD techniques.

Figure 26B:
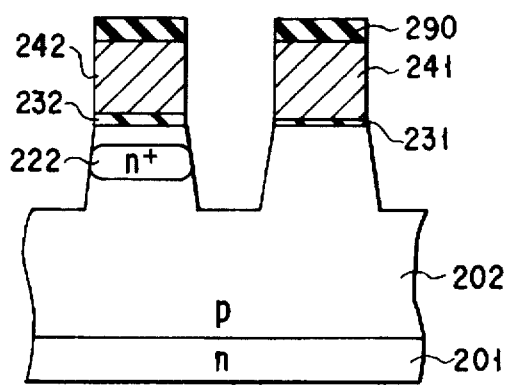
Figure 26C:
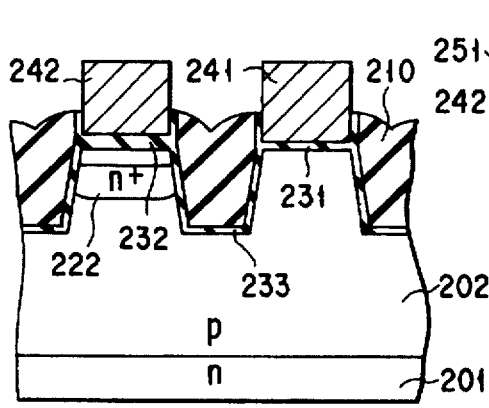

Next, as shown in FIG. 26B, the $SiO_2$ film 290, polysilicon film 240, gate insulating films 231, 232, and part of the surface of the p-well 202 in the trench element isolating section are etched away sequentially. This produces first gate insulating films 231, 232 and floating gates 241, 242. Thereafter, as shown in FIG. 26C, the surface of the p-well 202 is oxidized to a depth of, for example, 10 nm to form a $SiO_2$ film 233, and then, for example, a TEOS $SiO_2$ film is deposited to a thickness of, for example, 1000 nm. After that, etching back is done to form trench isolation 210.

Figure 26D:
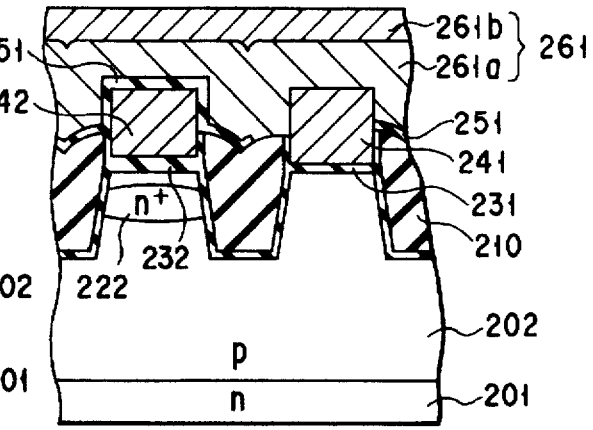
Figure 26E:
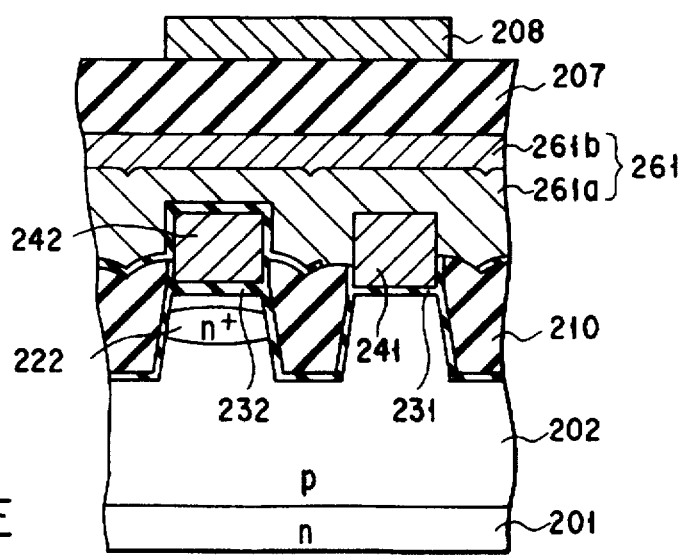

Then, as shown in FIG. 26D, on the floating gate 242 of polysilicon, an ONO film 251 is formed to a thickness of about 25 nm by oxidization and CVD techniques. Although he insulating film 251 is formed all over the memory cell section, it is selectively removed above the right-side enhancement-mode transistor. Thereafter, polysilicon 261a is deposited to a thickness of, for example, 200 nm and then, for example, a WSi film 261b is deposited, thereby forming a stacked select gate line 261.

Next, as shown in FIG. 26E, a $SiO_2$ interlayer insulating film 207 is deposited to a thickness of 1000 nm by CVD techniques. On the insulating film, a bit line 208 is formed. With the present embodiment, because the left-side select transistor to become a depletion-mode transistor has the thick gate insulating film 232 and the floating gate electrode 242 and further an $n^+$ diffusion layer 222 formed deep under the gate insulating film 232, a parasitic capacitance between the select gate 261 and the bit line 208 (bit-line diffusion layer) can be made smaller and consequently the potential of the select transistor can be placed at a specific value practically without being affected by the potential of the bit line.

Above-described embodiments according to the present invention are applied to NAND-cell type EEPROMs. However, the present invention is not limited to the NAND structure. The following embodiments are concerned with the applications to DINOR and AND type EEPROMs.

(Embodiment 14)

An equivalent circuit of the memory cell array according to the fourteenth embodiments of this invention is shown in FIG. 27, wherein parallelly connected memory cell array so called AND type is shown. An end of a first memory cell array which includes parallelly connected 32 memory cells M100–M131 is connected to a bit line D0 arranged in a column direction through select transistors $S_{11}$ and $S_{12}$, and another end of the first memory cell array is connected to a source line SL through a select transistor $S_{13}$. An end of a second memory cell array which includes parallelly connected 32 memory cells M200–M231 is connected to the same bit line D0 through select transistors S21 and S22, and another end of the second memory cell array is connected to the source line SL through a select transistor S23, as well.

In this embodiment select transistors S13 and S23 may be omitted, whereby a DINOR type EEPROM is formed.

Select gate lines ST1–ST3 are connected to the gate electrodes of the select transistors in a row direction, respectively.

Control gate lines W0–W31 are connected the gate electrodes the memory cells in the row direction, respectively.

D0–DN denote the bit lines formed on the select gate lines and the control gate lines with an insulating layer interposed therebetween.

Select transistors S11, S13, S22 and S23 are enhancement-mode transistors, and S12 and S21 are depletion-mode transistors, respectively. These transistors are provided to select either one of the first and second memory cell arrays.

The constructions of the select transistors as shown in the embodiments 1–13 can be applied to the select transistors for such parallelly connected memory cells as mentioned above. Specifically, the depletion-mode transistors S12 and S21 may have the the gate constructions such as each including a floating gate, or having a substantially thick gate oxide layer, or having a n- diffusion layer formed deeply under the gate electrode, thereby decreasing a parasitic capacitance between the bit line and the selection gate electrode.

(Embodiment 15)

An equivalent circuit of the memory cell array according to the fifteenth embodiments of this invention is shown in FIG. 28, wherein parallelly connected memory cell array so called Virtual Grand Array type is shown. An end of a first memory cell array which includes series- and parallel-connected 64 memory cells M100–M131 and M200–M231 is connected to a bit line BL1 arranged in a column direction through select transistors S11 and S12. An end of a second memory cell array which includes series- and parallel-connected 64 memory cells M300–M331 and M400–431 is connected to the same bit line BL1 through select transistors S21 and S22.

Source or drain regions each commonly owned by the series-connected memory cells adjacent to each other are coupled to a bit line BL2 through select transistors S13 and S14, or S23 and S24.

Select gate lines ST1–ST4 are connected to the gate electrodes of the select transistors in a row direction, respectively.

Control gate lines W0–W31 are connected the gate electrodes the memory cells in the row direction, respectively.

BL1–BL3 denote the bit lines formed on the select gate lines and the control gate lines with an insulating layer interposed therebetween.

Select transistors S11, S13, S22 and S24 are enhancement-mode transistors, and S12, S14, S21 and S23 are depletion-mode transistors, respectively. These transistors are provided to select either one of the first and second memory cell arrays.

The constructions of the select transistors as shown in the embodiments 1–13 can be applied to the select transistors for such parallelly connected memory cells as mentioned above. Specifically, the depletion-mode transistors S12, S14, S21 and S23 may have the the gate constructions such as each including a floating gate, or having a substantially thick gate oxide layer, or having a n- diffusion layer formed deeply under the gate electrode, thereby decreasing a parasitic capacitance between the bit line and the selection gate electrode.

The present invention is not limited to the above embodiments. While in the embodiments, the explanation has been given using NAND-cell, DINOR, AND and Virtual Grand Array type EEPROMs as examples, the invention may be applied to various types of EEPROMs other than the above-mentioned EEPROMs. Specifically, the present invention is not restricted to the control-gate-type EEPROM, but may be applied to NAND-cell EEPROMs using MNOS memory cells. In the case of what is called a mask ROM where a MOS transistor into which data is written permanently by channel ion implantation is used as memory, the invention can be applied to the mask ROM, provided that the mask ROM is formed so as to have a NAND structure.

Furthermore, the invention may be applied to the FACE type having diffusion layer bit lines. Additionally, the invention may be practiced or embodied in still other ways without departing from the spirit or essential character thereof.

As described above in detail, by reducing the capacitance between the gate electrodes of the select transistors connected to the memory cell units and the bit lines, the potential of the select transistors can be stabilized, making it possible to realize a nonvolatile semiconductor memory device which enables a higher-speed, more stable operation.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A nonvolatile semiconductor memory device comprising:
    a semiconductor substrate with a main surface;
    a plurality of memory cell units formed on said main surface of said semiconductor substrate, each of said memory cell units having a plurality of memory cells connected in one unit, each of said memory cells containing
    a first charge accumulation layer formed on said main surface of said semiconductor substrate in an insulating manner,
    a first control gate formed on said first charge accumulation layer in an insulating manner, and
    two first diffusion layers formed at said main surface of said semiconductor substrate on both side of said first charge accumulation layer, at least one of said two first diffusion layers being shared by adjacent one of said memory cells, thereby connecting said memory cells adjacent to each other;
    a plurality of first select transistors connected to one end of each of said plurality of memory cell units via one of said first diffusion layers located at the one end,
    each of said plurality of first select transistors containing a second control gate and a source and a drain region and being connected in series by adjacent one of said first select transistors sharing one of said source and said drain region, said second control gate being connected to each of a plurality of select gate lines,
    at least one of said plurality of first select transistors further containing
    a second charge accumulation layer on said main surface of said semiconductor substrate and under said second control gate in an insulating manner; and
    a data line connected to at least two adjacent ones of said memory cell units via said plurality of first select transistors.

2. A nonvolatile semiconductor memory device according to claim 1, wherein at least another one of said plurality of first select transistors includes a third charge accumulation layer electrically connected to said second control gate.

3. A nonvolatile semiconductor memory device according to claim 1, wherein at least one of said first select transistors in which said second charge accumulation layer and said second control gate are stacked in an insulating manner, further contains a second diffusion layer that is formed at said main surface of said substrate under said second charge accumulation layer and is of a same conductivity type as that of said source and said drain region and connected thereto, thereby forming a depletion-mode transistor.

4. A nonvolatile semiconductor memory device according to claim 1, wherein said plurality of first select transistors include a depletion-mode transistor and an enhancement-mode transistor.

5. A nonvolatile semiconductor memory device according to claim 1, wherein two of said memory cell units are coupled with said data line, one memory cell unit being connected to said data line via said first select transistors in which a first depletion-mode transistor and a first enhancement-mode transistor are connected in series, and another one of said memory cell units being connected to said data line via said first select transistors in which a second enhancement-mode transistor and a second depletion-mode transistor are connected in series.

6. A nonvolatile semiconductor memory device according to claim 5, wherein said first depletion-mode transistor and said second enhancement-mode transistor are connected to one of said select gate lines, and said second depletion-mode transistor and said first enhancement-mode transistor are connected to another one of said select gate lines.

7. A nonvolatile semiconductor memory device according to claim 1, wherein another end of each of said plurality of memory cell units which is unconnected to said data line is connected to a reference voltage line via at least one second select transistor.

8. Non-volatile semiconductor memory device according to claim 1, wherein each of said memory cell units includes said plurarity of memory cells connected in series along said data line.

9. Non-volatile semiconductor memory device according to claim 1, wherein each of said memory cell units includes said plurarity of memory cells connected in parallel along said data line.

10. Non-volatile semiconductor memory device according to a claim 1, wherein said first charge accumulation layer is formed of a same layer as said second charge accumulation layer of said first select transistor.

11. Non-volatile semiconductor memory device according to a claim 1, wherein said first control gate of each of said memory cells is formed of a same layer as said second control gate of each of said first select transistors.

12. A nonvolatile semiconductor memory device comprising:
    a semiconductor substrate with a main surface;
    a plurality of memory cell units formed on said main surface of said semiconductor substrate, each of said memory cell units having a plurality of memory cells connected in one unit, each of said memory cells containing
    a first charge accumulation layer formed on said main surface of said semiconductor substrate in an insulating manner,
    a first control gate formed on said charge accumulation layer in an insulating manner, and
    two first diffusion layers formed at said main surface of said semiconductor substrate on both side of said charge accumulation layer, at least one of said first diffusion layers being shared by adjacent one of said memory cells, thereby connecting said memory cells adjacent to each other;
    a plurality of first select transistors connected to one end of each of said plurality of memory cell units via one of said diffusion layers located at the one end,
    each of said plurality of first select transistors containing
    a gate insulating film formed on said main surface of said semiconductor substrate,
    a second control gate formed on said gate insulating film, and a source and a drain region formed at said main surface of said semiconductor substrate on both side of said second control gate, at least one of said source and said drain region being shared by adjacent one of said select transistors and connecting said adjacent one of said select transistors in series, said second control gate being connected to a corresponding one of a plurality of control gate lines, and said gate insulating film of at least one of said first select transistors being made thicker than said gate insulating film of another one of said first select transistors; and a data line connected to at least two adjacent ones of said memory cell units via said plurality of first select transistors.

13. A nonvolatile semiconductor memory device according to claim 12, wherein at least one of said first select transistors in which said first gate insulating film is made thicker than that of another one of said first select transistors, further contains a second diffusion layer that is formed at said main surface of said substrate under said first charge accumulation layer and is of a same conductivity type as that of said source and said drain region and connected thereto, thereby forming a depletion-mode transistor.

14. A nonvolatile semiconductor memory device according to claim 12, wherein said plurality of first select transistors include a depletion-mode transistor and an enhancement-mode transistor.

15. A nonvolatile semiconductor memory device according to claim 12, wherein two of said memory cell units are coupled with said data line, one memory cell unit being connected to said data line via said first select transistors in which a first depletion-mode transistor and a first enhancement-mode transistor are connected in series, and another one of said first memory cell units being connected to said data line via said first select transistors in which a second enhancement-mode transistor and a second depletion-mode transistor are connected in series.

16. A nonvolatile semiconductor memory device according to claim 15, wherein said first depletion-mode transistor and said second enhancement-mode transistor are connected to one of said select gate lines, and said second depletion-mode transistor and said first enhancement-mode transistor are connected to another one of said select gate lines.

17. A nonvolatile semiconductor memory device according to claim 12, wherein another end of each of said plurality of memory cell units which is unconnected to said data line is connected to a reference voltage line via at least one second select transistor.

18. A nonvolatile semiconductor memory device according to claim 12, wherein at least one of said plurality of first select transistors further contains a second charge accumulation layer on said main surface of said semiconductor substrate and under said second control gate in an insulating manner.

19. A nonvolatile semiconductor memory device comprising:

a semiconductor substrate with a main surface;

a plurality of memory cell units formed on said main surface of said semiconductor substrate, each of said memory cell units having a plurality of memory cells connected in one unit, each of said memory cells containing a first charge accumulation layer formed on said main surface of said semiconductor substrate in an insulating manner, a first control gate formed on said charge accumulation layer in an insulating manner, and two first diffusion layers formed at said main surface of said semiconductor substrate on both side of said charge accumulation layer, at least one of said two first diffusion layers being shared by adjacent one of said memory cells, thereby connecting said memory cells adjacent to each other;

a plurality of first select transistors connected to one end of each of said plurality of memory cell units via one of said diffusion layers located at the one end, each of said plurality of first select transistors containing a second control gate formed on said main surface of said semiconductor substrate in an insulating manner, and a source and a drain region formed at said main surface of said semiconductor substrate on both side of said second control gate, at least one of said source and said drain region being shared by adjacent one of said first select transistors and connecting said adjacent one of said memory cells in series, said second control gate being connected to a corresponding one of a plurality of control gate lines, and at least one of said plurality of first select transistors having a second diffusion layer of a same conductivity type as that of said source and said drain region in said semiconductor substrate, said second diffusion layer being electrically connected to said source and said drain region; and a data line connected to at least two adjacent ones of said memory cell units via said plurality of first select transistors.

20. A nonvolatile semiconductor memory device according to claim 19, wherein at least one of said plurality of first select transistors further contains a second charge accumulation layer on said main surface of said semiconductor substrate and under said second control gate in an insulating manner.

21. A nonvolatile semiconductor memory device according to claim 19, wherein at least one of said plurality of first select transistors contains a layer of a conductivity type opposite to that of said source and said drain region formed at said main surface of said substrate under said second control gate, and thereunder is formed said second diffusion layer that is of the same conductivity type of that of said source and said drain region and connected thereto.

22. A nonvolatile semiconductor memory device according to claim 19, wherein said plurality of first select transistors include a depletion-mode transistor and an enhancement-mode transistor.

23. A nonvolatile semiconductor memory device according to claim 19, wherein two of said memory cell units are coupled with said data line, one memory cell unit being connected to said data line via said first select transistors in which a first depletion-mode transistor and a first enhancement-mode transistor are connected in series, and another one of said memory cell units being connected to said data line via said first select transistors in which a second enhancement-mode transistor and a second depletion-mode transistor are connected in series.

24. A nonvolatile semiconductor memory device according to claim 23, wherein said first depletion-mode transistor and said second enhancement-mode transistor are connected to one of said select gate lines, and said second depletion-mode transistor and said first enhancement-mode transistor are connected to another one of said select gate lines.

25. A nonvolatile semiconductor memory device according to claim 19, wherein another end of each of said plurality of memory cell units which is unconnected to said data line is connected to a reference voltage line via at least one second select transistor.

* * * * *